United States Patent
Kapusta, Jr. et al.

(10) Patent No.: US 7,298,151 B2
(45) Date of Patent: Nov. 20, 2007

(54) METHODS AND APPARATUS FOR REDUCING THERMAL NOISE

(75) Inventors: Ronald A. Kapusta, Jr., Waltham, MA (US); Katsufumi Nakamura, Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 229 days.

(21) Appl. No.: 11/001,999

(22) Filed: Dec. 2, 2004

(65) Prior Publication Data

US 2005/0237694 A1    Oct. 27, 2005

Related U.S. Application Data

(60) Provisional application No. 60/564,386, filed on Apr. 21, 2004.

(51) Int. Cl.
   G01R 29/26    (2006.01)
   H03F 1/26    (2006.01)
(52) U.S. Cl. ............... 324/613; 324/76.15; 374/175
(58) Field of Classification Search ........... 324/76.15, 324/613–616
   See application file for complete search history.

(56) References Cited

U.S. PATENT DOCUMENTS

| | | | |
|---|---|---|---|
| 3,584,295 A * | 6/1971 | Bayer et al. ............. | 324/650 |
| 3,787,755 A * | 1/1974 | Goldner ............... | 363/127 |
| 4,289,399 A * | 9/1981 | Uchida ............... | 356/226 |
| 4,468,749 A * | 8/1984 | Kato et al. ............. | 327/337 |
| 4,510,624 A * | 4/1985 | Thompson et al. ......... | 455/223 |
| 5,028,893 A * | 7/1991 | Marrah et al. ........... | 333/173 |
| 5,351,050 A | 9/1994 | Thompson et al. | |
| 5,708,376 A | 1/1998 | Ikeda | |
| 5,909,131 A | 6/1999 | Singer et al. | |

(Continued)

FOREIGN PATENT DOCUMENTS

JP    60154399 A    8/1985

(Continued)

OTHER PUBLICATIONS

Bruccoleri F. et al., "Wide-Band CMOS Low-Noise Amplified Exploiting Thermal Noise Canceling", *IEEE*, vol. 39, No. 2, pp. 275-282, Feb. 2004.

(Continued)

*Primary Examiner*—Anjan Deb
(74) *Attorney, Agent, or Firm*—Wolf, Greenfield & Sacks, P.C.

(57) ABSTRACT

Methods and apparatus for reducing the thermal noise integrated on a storage element are disclosed. One embodiment of the invention is directed to a sampling circuit comprising a sampling capacitor to store a charge, the sampling capacitor being exposed to an ambient temperature. The sampling circuit further comprises circuitry to sample the charge onto the capacitor, wherein thermal noise is also sampled onto the capacitor, and wherein the circuitry is constructed such that the power of the thermal noise sampled onto the capacitor is less than the product of the ambient temperature and Boltzmann's constant divided by a capacitance of the sampling capacitor. Another embodiment of the invention is directed to a method of controlling thermal noise sampled onto a capacitor. The method comprises an act of independently controlling the spectral density of the thermal noise and/or the bandwidth of the thermal noise.

23 Claims, 16 Drawing Sheets

U.S. PATENT DOCUMENTS

| | | | | |
|---|---|---|---|---|
| 6,463,295 | B1* | 10/2002 | Yun | 455/522 |
| 2004/0183549 | A1* | 9/2004 | Takayanagi | 324/658 |
| 2005/0237694 | A1* | 10/2005 | Kapusta et al. | 361/271 |
| 2006/0033561 | A1* | 2/2006 | Perdoor et al. | 330/9 |

FOREIGN PATENT DOCUMENTS

| | | |
|---|---|---|
| JP | 11274868 A | 10/1999 |
| JP | 2001004681 A | 1/2001 |
| RU | 2093944 C1 * | 10/1997 |

OTHER PUBLICATIONS

Bruccoleri, F. et al., Noise Cancelling in Wideband CMOS LNAs, *ISSCC 2002, RF Systems*, Session 24, Feb. 6, 2002.

Charles, C.T. et al., "A Floating Gate Common Mode Feedback Circuit for Low Noise Amplifiers", *IEEE*, 0-7803-7778-Aug. 2003, pp. 180-185, 2003.

Dias, V.F. et al., "Fundamental Limitations of Switched-Capacitor Sigma-Delta Modulators", *IEEE*, vol. 139, No. 1, pp. 27-32, Feb. 1, 1992.

Dias, V.F. et al., "Harmonic Distortion in SC Sigma-Delta Modulators", *IEEE*, vol. 41, No. 4, pp. 326-329.

Kim, B. et al., Noise Bandwidth Suppression for Low Noise Readout Circuit, *Electronics Letters*, vol. 38, No. 12, pp. 558-560, Jun. 6, 2002.

Oliaei, O., "Thermal Noise Analysis of Multi-Input Sc-Integrators for Delta-Sigma Modulator Design", *IEEE*, vol. 4, pp. 425-428, May 28, 2000.

Shen, D.H. et al., A 900MHZ Integrated Discrete-Time Filtering RF Front-End, *IEEE*, vol. 39, pp. 54-55, 417, Feb. 1996.

Zare-Hoseini, H. et al., A Very Low-Noise, Low-Power Integrator for High-Resolution 'Delta!'Sigma! modulators, *IEEE*, vol. 2, pp. 802-805, Dec. 14, 2003.

Examination Report dated Mar. 6, 2007 for corresponding European Application Serial No. 05 738 010.7.

* cited by examiner

METHODS AND APPARATUS FOR REDUCING THERMAL NOISE

CROSS-REFERENCE TO RELATED APPLICATION

This application claims the benefit, under 35 U.S.C. §119(e), of the filing date of U.S. provisional application Ser. No. 60/564,386 entitled "Methods and Apparatus for Reducing the Thermal Noise in Sampling Circuits," filed Apr. 21, 2004 and incorporated herein by reference.

FIELD OF THE INVENTION

The present invention is directed to the field of reducing thermal noise in circuits.

DESCRIPTION OF THE RELATED ART

One problem associated with sampling circuits, such as switched capacitor circuits, is that each time a signal is sampled, thermal noise is also sampled. Thermal noise arises due to the random motion of free electrons in a conducting medium. Each free electron inside the medium is in motion due to its thermal energy. Since capacitors are noiseless devices, the capacitors of sampling circuits do not have any thermal noise associated with them. However, thermal noise will be present in the switch used for the sample operation or an amplifier used for the sample operation. The sampled thermal noise introduces undesired disturbances into the sampled signal.

The integrated thermal noise power of a sampling circuit is the product of the thermal noise spectral density and the thermal noise bandwidth of the circuit. In the case where a switch is used in connection with a sample and hold operation, the thermal noise spectral density and the thermal noise bandwidth are calculated in part based on the on-resistance of the switch. In the case where an amplifier is used in connection with the sample and hold operation, the thermal noise spectral density and the thermal noise bandwidth are calculated in part based on the transconductance of the amplifier. In conventional sampling circuits, the spectral density and the bandwidth of the thermal noise are dominated by the same element, for example the switch or the amplifier, of the sampling circuit. When the integrated thermal noise power is calculated, the result is kT/C, where k is Boltzmann's constant, T is the ambient temperature, and C is the capacitance of the sampling capacitor, because the on-resistance of the switch or the transconductance of the amplifier cancels in the spectral density and bandwidth terms. Although the capacitance of the sampling capacitor selected can be increased to reduce the sampled thermal noise, large capacitance is undesirable because larger capacitors in a sampling circuit consume more power and space.

FIG. 1 illustrates a conventional sample and hold circuit having an integrated thermal noise power of kT/C. Circuit 2 includes a switch 1 coupled between an input voltage 3 and a capacitor 5 coupled to ground. Switch 1 is switchable between an on state and off state via switch control signal 7. When switch 1 is switched to an on state, which represents a closed position, a charge proportional to input voltage 3 is stored on capacitor 5. When switch 1 is switched to an off state, the charge on the capacitor is frozen. Although capacitor 5 is a noiseless element, switch 1 is not. Hence, when the charge is sampled onto capacitor 5, thermal noise is also sampled. The power of the sampled thermal noise can be expressed as shown below in Equation 1.

$$\text{noise power} = (\text{noise power spectral density}) * (\text{noise bandwidth}) \quad (1)$$

The noise power spectral density of the sampled thermal noise can be expressed as shown below in Equation 2:

$$\text{noise power spectral density} = (4kTR_{ON}) \quad (2)$$

where k is Boltzmann's constant, T is the ambient temperature, and $R_{ON}$ is the on resistance of switch 1. The bandwidth of the sampled thermal noise can be expressed as shown below in Equation 3:

$$\text{noise bandwidth} = \left( \frac{1}{R_{ON}C} * \frac{\pi}{2} * \frac{1}{2\pi} \right) \quad (3)$$

where C is the capacitance of capacitor 5 on which charge is sampled. In Equation 3, the first term ($1/R_{ON}C$) represents the bandwidth of the switched capacitor circuit (in radians/second). The second term ($\pi/2$), when multiplied by the first term, represents the noise bandwidth of the switched capacitor circuit. The third term ($1/2\pi$) converts the bandwidth in radians/second to a bandwidth in cycles/second or Hertz. By applying Equations 2 and 3 to Equation 1, the sampled thermal noise power (in $V^2$) can be expressed as shown in Equation 4.

$$\text{noise power} = (4kTR_{ON}) * \left( \frac{1}{R_{ON}C} * \frac{\pi}{2} * \frac{1}{2\pi} \right) \quad (4)$$

By canceling terms, Equation 4 may be simplified to Equation 5, shown below.

$$\text{noise power} = \frac{kT}{C} \quad (5)$$

FIG. 2 illustrates another conventional sample and hold circuit. In this circuit, an amplifier is used to buffer the sampled voltage during the hold mode of the circuit. Circuit 9 includes a first sample switch 11 coupled between an input voltage 13 and a first hold switch 15 coupled to ground. A first capacitor 17 is coupled between first sample switch 11 and a second sample switch 19 coupled to ground. An amplifier 21 of circuit 9 includes an inverting input 23 coupled between the second sample switch 19 and a second capacitor 27. A second hold switch 29 is coupled between second capacitor 27 and an output 31 of amplifier 21. A non-inverting input 25 of amplifier 21 is coupled to ground.

During a sample phase of circuit 9, first and second sample switches 11 and 19 are switched to an on state (i.e., closed) via first and second switch control signals 33 and 35, respectively, while hold switches 15 and 29 remain off. When this occurs, first capacitor 17 is coupled between input voltage 13 and ground and a charge proportional to input voltage 13 is stored on first capacitor 17. During a hold phase of circuit 9, first and second hold switches 15 and 29 are switched to an on state via third and fourth switch control signals 34 and 36, respectively, while first and second sample switches 11 and 19 are switched to an off state. When first and second sample switches 11 and 19 are switched to an off state, the charge on first capacitor 17 is frozen. When first and second hold switches 15 and 29 are switched to an on state, the charge previously stored on first capacitor 17 will be transferred to second capacitor 27.

For convenience, we will assume that the second sample switch 19 dominates both the spectral density and the bandwidth of the thermal noise sampled on the first capacitor 17. The analysis for sampled thermal noise on the first capacitor 17 is the same as for the capacitor 5 in FIG. 1. Thus, the power of the sampled thermal noise is kT/C [$V^2$], where C is the capacitance of the first capacitor 17.

An alternative to the configuration of FIG. 2 is shown in FIG. 3. In FIG. 3, an amplifier is coupled via a switch in unity gain negative feedback to set the potential at one side of the capacitor on which charge is sampled. This configuration is advantageous because the input voltage may be sampled while the amplifier is auto-zeroed, thereby reducing amplifier offset and low-frequency noise during the hold phase of the circuit. In particular, the unity gain feedback of the amplifier in this configuration reduces the effective offset and low frequency noise during hold mode at inverting input 47.

Circuit 37 includes a first sample switch 39 coupled between an input voltage 41 and a first hold switch 43 coupled to ground. A first capacitor 45 is coupled at one end between the first sample switch 39 and the first hold switch 43, and at the other end to an inverting input 47 of an amplifier 49. A second capacitor 51 and a second hold switch 53 are coupled in series between the inverting input 47 and an output 55 of amplifier 49. A second sample switch 57 is coupled in parallel with second capacitor 51 and second hold switch 53. A non-inverting input 59 of amplifier 49 is coupled to ground.

During a sample phase of circuit 37, first and second sample switches 39 and 57 are switched to an on state (i.e., closed) via first and second switch control signals 61 and 63, respectively, while hold switches 43 and 53 remain off. The switching of second sample switch 57 to an on state configures amplifier 49 in a unity gain feedback configuration, which auto-zeros the amplifier. When this occurs, first capacitor 45 is coupled between input voltage 41 and a virtual ground at inverting input 47 of amplifier 49, and a charge proportional to input voltage 41 is stored on first capacitor 45. During a hold phase of circuit 37, first and second hold switches 43 and 53 are switched to an on state via third and fourth switch control signals 62 and 64, respectively, while first and second sample switches 39 and 57 are switched to an off state. When first and second sample switches 39 and 57 are switched to an off state, the charge on first capacitor 45 is frozen. When first and second hold switches 43 and 53 are switched to an on state, the charge previously stored on first capacitor 45 will be transferred to second capacitor 51.

In the configuration of FIG. 3, amplifier 49 will typically limit the bandwidth of the auto-zero sampling loop and therefore also the thermal noise bandwidth, and will be the dominant thermal noise source. Second sample switch 57 is not the dominant noise source because it is in the feedback loop of amplifier 49. Therefore, any noise generated by second sample switch 57 will be negligible when referenced back to inverting input 47 due to the gain of amplifier 49. If we assume that the amplifier has a single stage and that the input transistors of amplifier 49 are the dominant thermal noise source, the noise power spectral density of the sampled thermal noise can be expressed as shown below in Equation 6:

$$\text{noise power spectral density} = \left(2 * \frac{8kT}{3g_m}\right) \quad (6)$$

where k is Boltzmann's constant, T is the ambient temperature, and $g_m$ is the transconductance of the amplifier input pair. The noise bandwidth of the sampled thermal noise can be expressed as shown below in Equation 7:

$$\text{noise bandwidth} = \left(\frac{g_m}{C} * \frac{1}{2\pi} * \frac{\pi}{2}\right) \quad (7)$$

where C is the capacitance of capacitor 45 on which charge is sampled. In Equation 7, the first term ($g_m/C$) represents the bandwidth of the amplifier (in radians/second). The second term ($\pi/2$), when multiplied by the first term, represents the thermal noise bandwidth of the switched capacitor circuit. The third term ($1/2\pi$) converts the bandwidth in radians/second to a bandwidth in cycles/second or Hertz. By applying Equations 6 and 7 to Equation 1, the sampled thermal noise power (in $V^2$) can be expressed as shown in Equation 8.

$$\text{noise power} = \left(2 * \frac{8kT}{3g_m}\right) * \left(\frac{g_m}{C} * \frac{1}{2\pi} * \frac{\pi}{2}\right) \quad (8)$$

By canceling terms, Equation 8 may be simplified to Equation 9, shown below.

$$\text{noise power} = \frac{4}{3} * \frac{kT}{C} \quad (9)$$

Thus, it may be appreciated that, as was the case with Equation 5, the power of the thermal noise sampled by first capacitor 45 depends on the capacitance of the first capacitor 45. In Equation 9, however, the power of the thermal noise sampled by first capacitor 45 is greater than kT/C due to the 4/3 factor that results from the thermal noise contribution of the input differential pair of transistors within amplifier 49. The thermal noise power will be greater still if amplifier 49 includes two stages or if thermal noise sources other than the input differential pair of amplifier 49 contribute significantly to the thermal noise.

In the prior art sampling circuits described above, the thermal noise is greater than or equal to kT/C. Moreover, there are no means to affect the integrated thermal noise other than the sampling capacitor. Assuming the ambient temperature T is fixed, larger sampling capacitors are needed to reduce sampled thermal noise. However, larger sampling capacitors are undesirable because they increase the silicon area required for an integrated sampling circuit, thereby increasing the overall size of the circuit. In addition, larger sampling capacitors require more power and are more difficult for the input to drive.

In view of the foregoing, it is an object of the present invention to provide methods and apparatus for reducing the thermal noise integrated on a storage element.

SUMMARY OF THE INVENTION

One embodiment of the invention is directed to a sampling circuit comprising a sampling capacitor to store a charge, the sampling capacitor being exposed to an ambient temperature. The sampling circuit further comprises circuitry to sample the charge onto the capacitor, wherein thermal noise is also sampled onto the capacitor, and wherein the circuitry is constructed such that the power of the thermal noise sampled onto the capacitor is less than the product of the ambient temperature and Boltzmann's constant divided by a capacitance of the sampling capacitor.

Another embodiment of the invention is directed to a circuit comprising an energy storage element comprising an input and output, and circuitry coupled to the energy storage element to control a signal stored in the energy storage element. The signal includes thermal noise having an associated spectral density and bandwidth, and a portion of the circuitry that dominates the thermal noise spectral density has an effective impedance of $Z_{NSD}$ and a portion of the circuitry that dominates the thermal noise bandwidth has an effective impedance of $Z_{BW}$, wherein $Z_{NSD}$ is less than $Z_{BW}$.

A further embodiment of the invention is directed to a method of controlling thermal noise sampled onto a capacitor. The method comprises an act of independently controlling the spectral density of the thermal noise and/or the bandwidth of the thermal noise.

Another embodiment of the invention is directed to an circuit comprising an input and an output, an amplifier coupled to the input, and an attenuator coupled between the amplifier and the output. The attenuator is adapted to limit the bandwidth of a signal at the output of the circuit and contribute less noise to the signal than the amplifier.

BRIEF DESCRIPTION OF THE DRAWINGS

Various embodiments of the invention will now be described, by way of example, with reference to the accompanying drawings, in which.

DETAILED DESCRIPTION

Figure 1:
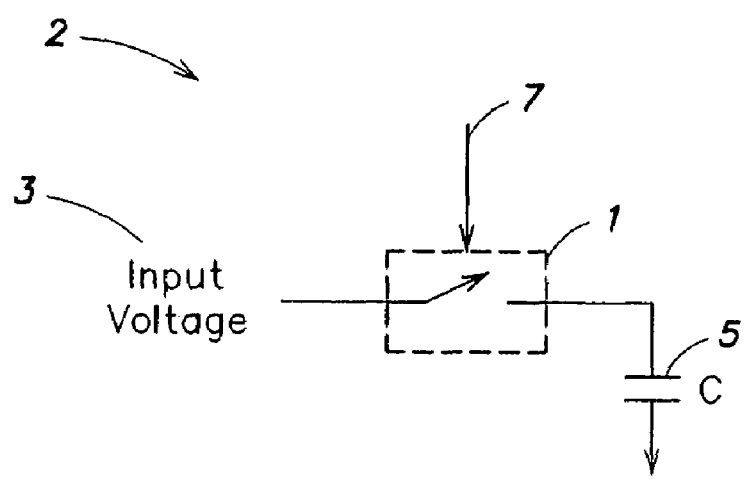
FIG. 1 illustrates a prior art sampling circuit.

Applicant has appreciated that by implementing a circuit (e.g., a sampling circuit) such that the spectral density and the bandwidth of the thermal noise are determined by different factors, thermal noise integrated on a capacitor of the circuit may be reduced below kT/C. Specifically, if the spectral density and the bandwidth of the thermal noise are determined by different factors, for example because they are dominated by different elements of the circuit, the bandwidth and spectral density equations will contain terms (other than k, T, and C) that can be independently controlled and do not cancel when the integrated thermal noise power is computed. Thermal noise may also be reduced in circuits having non-capacitive storage elements (e.g., inductors) by implementing a circuit such that the spectral density and the bandwidth of the thermal noise are determined by different factors.

Embodiments of the invention relate to methods and apparatus for reducing the thermal noise integrated on a storage element. Exemplary methods and apparatus for reducing thermal noise described herein relate to reducing the thermal noise in sampling circuits. In particular, this application discloses methods and apparatus for reducing the sampled thermal noise power of switched capacitor circuits below kT/C, where k is Boltzmann's constant, T is the ambient temperature, and C is the capacitance of the capacitor on which charge is sampled. Also disclosed are methods and apparatus for implementing a sampling circuit such that the spectral density and the bandwidth of the integrated thermal noise are dominated by different elements and/or determined by different factors of the sampling circuit.

It should be appreciated that while examples relating the reduction of thermal noise in sampling circuits are described herein, the invention is not limited in this respect. For example, the principles described in connection with sampling circuits can be applied to reduce the thermal noise integrated on a storage element, such as a capacitor or inductor, that is not in a sampling circuit. In the case of an inductor, the thermal noise integrated therein may be reduced below kT/L by implementing a circuit such that the spectral density and the bandwidth of the integrated thermal noise are dominated by different elements of the circuit.

According to one embodiment of the invention, a circuit including a storage element is implemented such that the spectral density and the bandwidth of the thermal noise integrated on the storage element are controlled by different variables. In particular, the portion of the circuit that dominates the thermal noise spectral density may have an effective impedance of $Z_{NSD}$ and the portion of the circuit that dominates the thermal noise bandwidth may have an effective impedance of $Z_{BW}$. If the storage element is a capacitor that samples a charge along with some thermal noise, the bandwidth of the sampled thermal noise can be described by Equation 10:

$$\text{noise bandwidth} = \frac{1}{Z_{BW}C} * \frac{1}{2\pi} * \frac{\pi}{2} \quad (10)$$

where C is the capacitance of the capacitor and $Z_{BW}$ is the effective impedance of the portion of the circuit that dominates the thermal noise bandwidth. The spectral density of the sampled noise can be described by Equation 11:

$$\text{noise spectral density} = 4kTZ_{NSD} \quad (11)$$

where k is Boltzmann's constant, T is the ambient temperature, and $Z_{NSD}$ is the effective impedance of the portion of the circuit that dominates the thermal noise spectral density.

By applying Equations 10 and 11 to Equation 1, the sampled thermal noise power (in $V^2$) can be expressed as shown in Equation 12.

$$\text{noise power} = (4kTZ_{NSD}) * \left( \frac{1}{Z_{BW}C} * \frac{1}{2\pi} * \frac{\pi}{2} \right) \quad (12)$$

By canceling terms, Equation 12 may be simplified to Equation 13, shown below.

$$\text{noise power} = \frac{Z_{NSD}}{Z_{BW}} * \frac{kT}{C} \quad (13)$$

Figure 2:
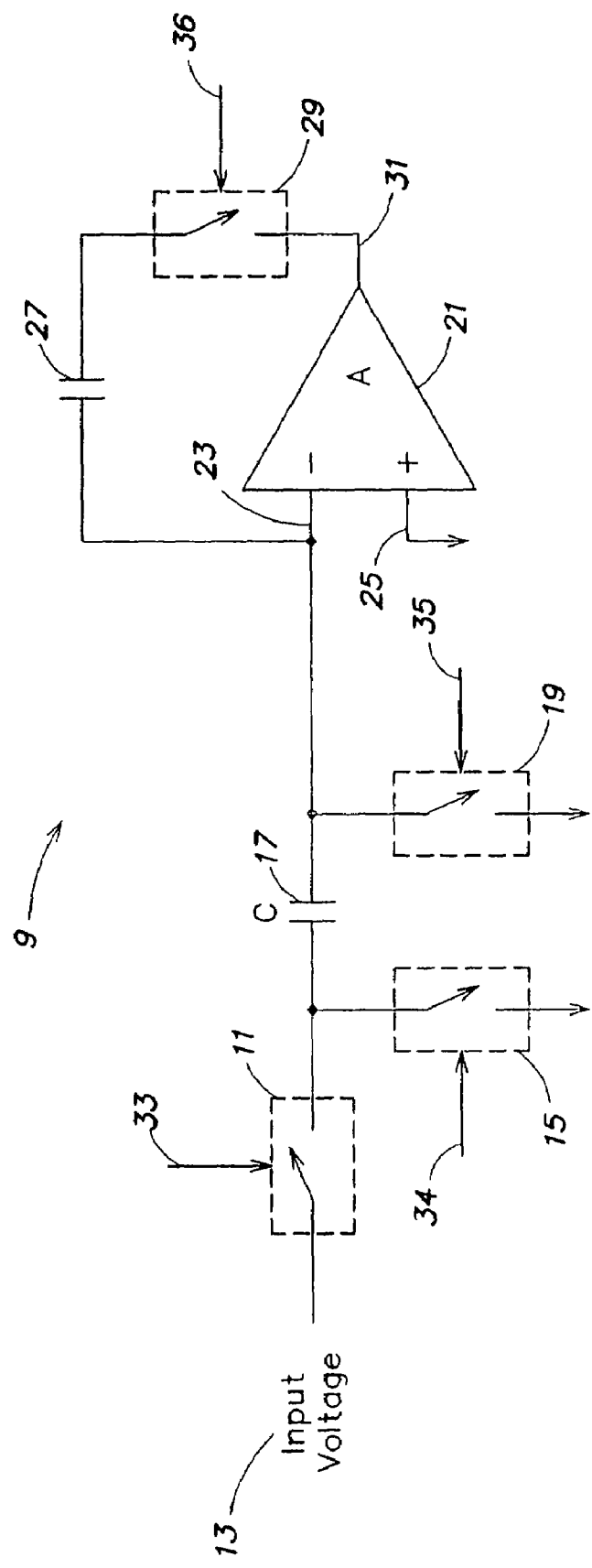
FIG. 2 illustrates a prior art sample and hold circuit.
Figure 3:
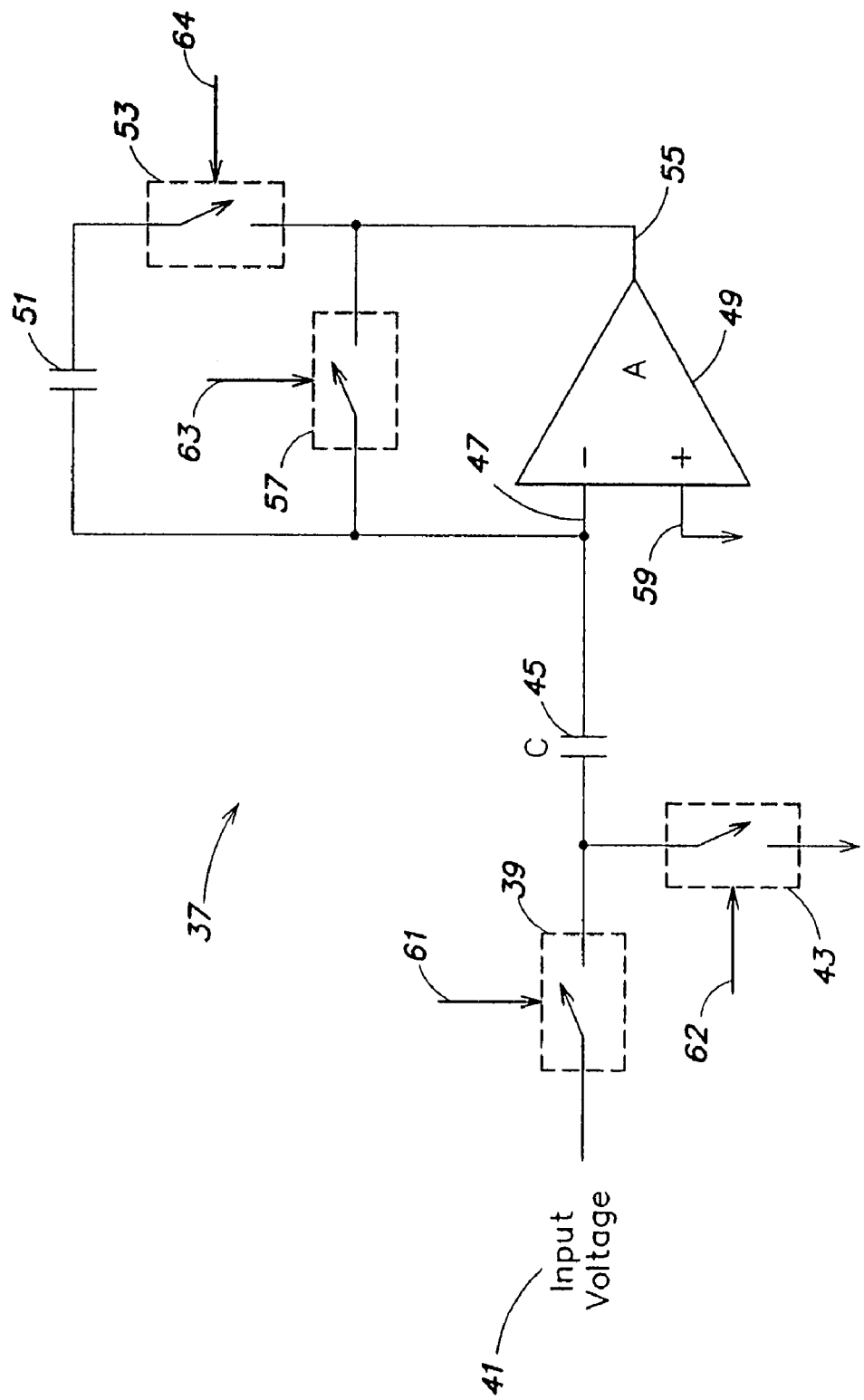
FIG. 3 illustrates another prior art sample and hold circuit.

Unlike the prior art circuits of FIGS. 1-3, in the present embodiment, the factor that determines the thermal noise bandwidth is independent from the factor that determines the thermal noise spectral density. Thus, $Z_{NSD}$ and $Z_{BW}$ do not cancel in Equation 12 and are carried over to Equation 13.

If the circuit is implemented such that the effective impedance of the portion of the circuit that dominates the thermal noise spectral density is smaller than the effective impedance of the portion of the circuit that dominates the thermal noise bandwidth, i.e., such that Equation 14 is satisfied, the sampled noise can be reduced below kT/C.

$$Z_{NSD} < Z_{BW} \quad (14)$$

When Equation 14 is satisfied, the sampled noise power will be some fraction of kT/C determined by the ratio between the effective impedance of the portion of the circuit that dominates the thermal noise spectral density and the effective impedance of the portion of the circuit that dominates the thermal noise bandwidth. In other words, if $Z_{NSD}$ is less than $Z_{BW}$ (Equation 14), the $Z_{NSD}/Z_{BW}$ term in Equation 13 will be less than one and the sampled thermal noise power will be less than kT/C, as illustrated in Equation 15:

$$\text{noise power} < \frac{kT}{C} \quad (15)$$

Figure 4:
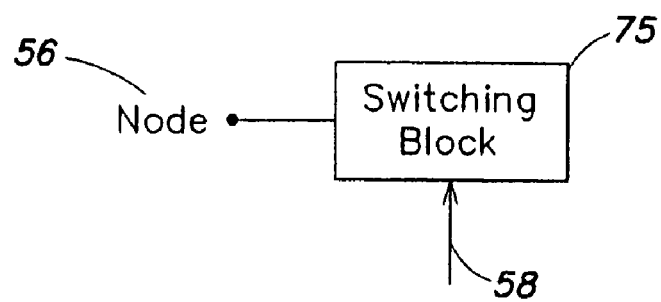
FIG. 4 illustrates a sampling circuit according to an embodiment of the invention.

FIG. 4 functionally illustrates a switching circuit satisfying Equation 15 according to an embodiment of the invention when used with a sampling capacitor at node 56. Switching block 75 freezes a charge at a node 56 thereof in response to a switch control signal 58. Switching block 75 is implemented such that it controls the bandwidth of the sampled thermal noise. In addition, the switching block is implemented such that, although it dominates the spectral density and the bandwidth of the sampled thermal noise, the effective impedance that determines the thermal noise spectral density and the effective impedance that determines the thermal noise bandwidth are different. In particular, the effective impedance that determines the thermal noise spectral density is less than the effective impedance that determines the thermal noise bandwidth, such that Equation 15 is satisfied.

Figure 5:
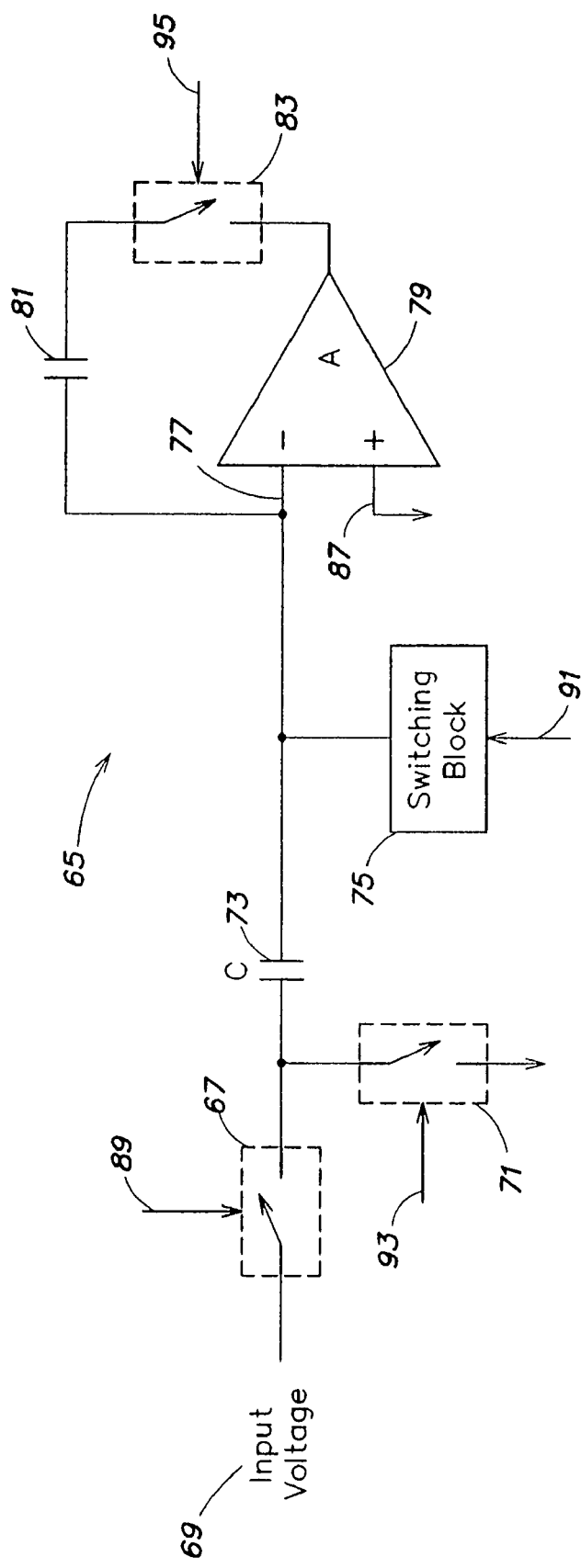
FIG. 5 illustrates a sample and hold circuit according to an embodiment of the invention, wherein the sample and hold circuit is a modified version of the circuit of FIG. 2 including a switching block.

FIG. 5 illustrates an embodiment of the invention according to which the sample and hold circuit of FIG. 2 may be modified to satisfy Equation 15. In particular, the sample and hold circuit 65 of FIG. 5 omits the second sample switch 19 of FIG. 2 and includes switching block 75 described in connection with FIG. 4. As discussed above, switching block 75 is implemented such that the effective impedance that determines the thermal noise spectral density is less than the effective impedance that determines the thermal noise bandwidth. Thus, unlike the sample and hold circuit of FIG. 2, the sampled thermal noise power in the sample and hold circuit 65 of FIG. 4 is less than kT/C because the $Z_{NSD}/Z_{BW}$ term in Equation 13 will be less than one.

The circuit 65 of FIG. 5 includes a first sample switch 67 coupled between an input voltage 69 and a first hold switch 71 coupled to ground. A first capacitor 73 is coupled at one end to the first sample switch 67 and the first hold switch 71. The other end of capacitor 73 is coupled to switching block 75 and an inverting input 77 of an amplifier 79. A second capacitor 81 and a second hold switch 83 are coupled in series between the inverting input 77 and an output 85 of amplifier 79. A non-inverting input 87 of amplifier 79 is coupled to ground.

During a sample phase of circuit 65, sample switch 67 is switched to an on state (i.e., a closed position) via first control signals 89, respectively, while hold switches 71 and 83 remain off (i.e., open). Likewise, during a sample phase of circuit 65, switching block 75 is also switched to an on state, such that a connection is made between first capacitor 73 and ground or another voltage. Second control signal 91 controls the state of switching block 75. Thus, during a sample phase of circuit 65, first capacitor 73 is coupled between input voltage 69 and another voltage provided by switching block 75, and a charge proportional to input voltage 69 is stored on first capacitor 73. During a hold phase of circuit 65, first and second hold switches 71 and 83 are switched to an onstate via third and fourth switch control signals 93 and 95, respectively, while sample switch 67 and switching block 75 are switched to an off state. When sample switch 67 and switching block 75 are switched to an off state, the charge on first capacitor 73 is frozen. When first and second hold switches 71 and 83 are switched to an on state, the charge previously stored on first capacitor 73 will be transferred to second capacitor 81.

Although FIG. 5 illustrates an embodiment of the invention according to which the sample and hold circuit of FIG. 2 is modified to include switching block 75 and thereby satisfy Equation 15, it should be appreciated that the invention is not limited in this respect. The principles of the embodiment of FIG. 5 may be applied to other sample and hold circuit designs, and the particular configuration of circuit 65 is merely exemplary.

Figure 6:
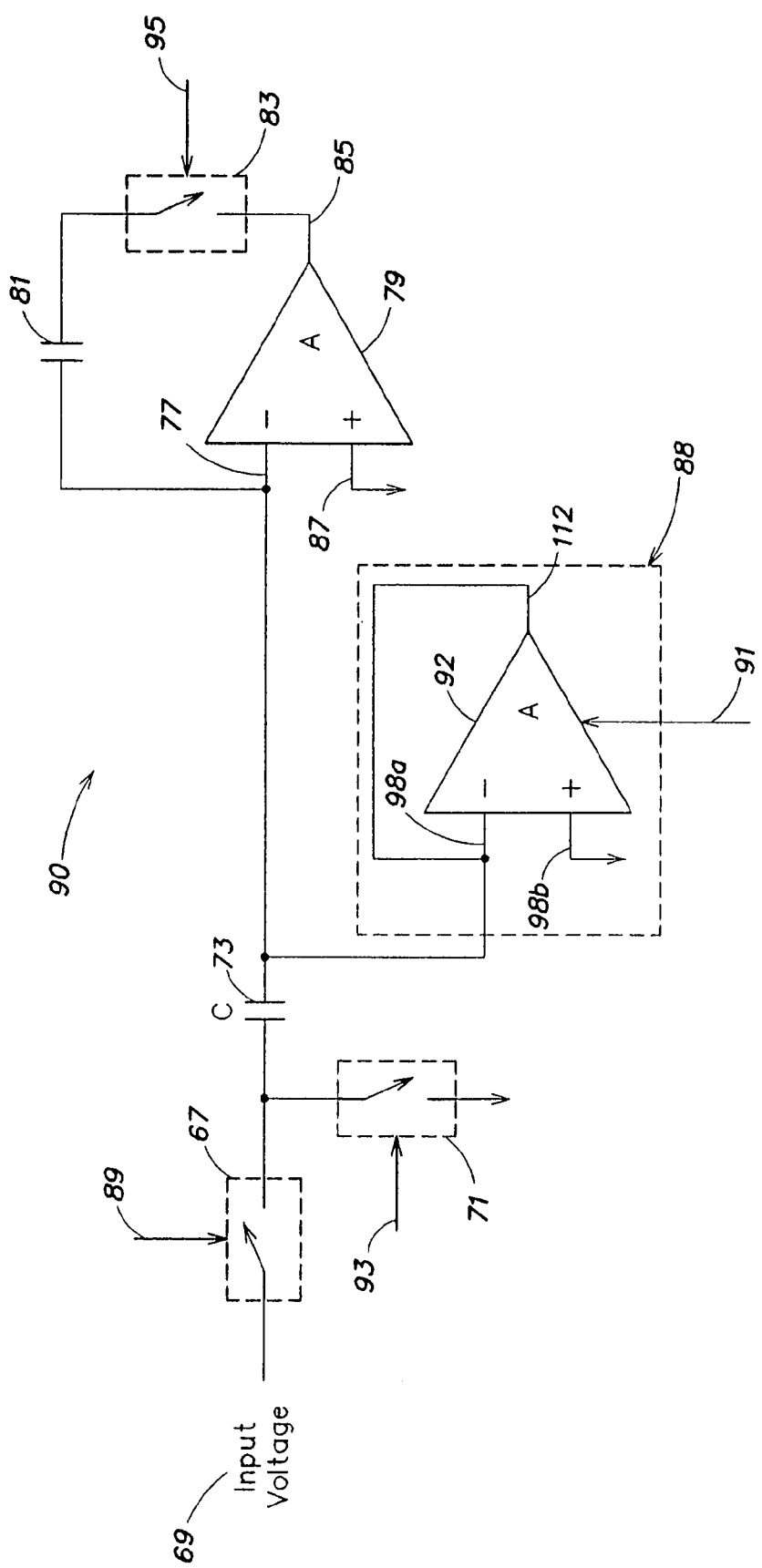
FIG. 6 illustrates a sample and hold circuit according to an embodiment of the invention, wherein the switching block of FIG. 5 has been implemented using an amplifier.

FIG. 6 illustrates an embodiment of the invention according to which the switching block of FIG. 5 is implemented using an amplifier. In particular, in the sample and hold circuit 90 of FIG. 6, the switching block 75 of FIG. 5 is replaced with switching block 88, which includes an amplifier 92. Sample and hold circuit 90 operates in substantially the same manner as sample and hold circuit 65 of FIG. 5. Amplifier 92 is implemented such that the effective impedance that determines the thermal noise spectral density is less than the effective impedance that determines the thermal noise bandwidth.

Figure 7:
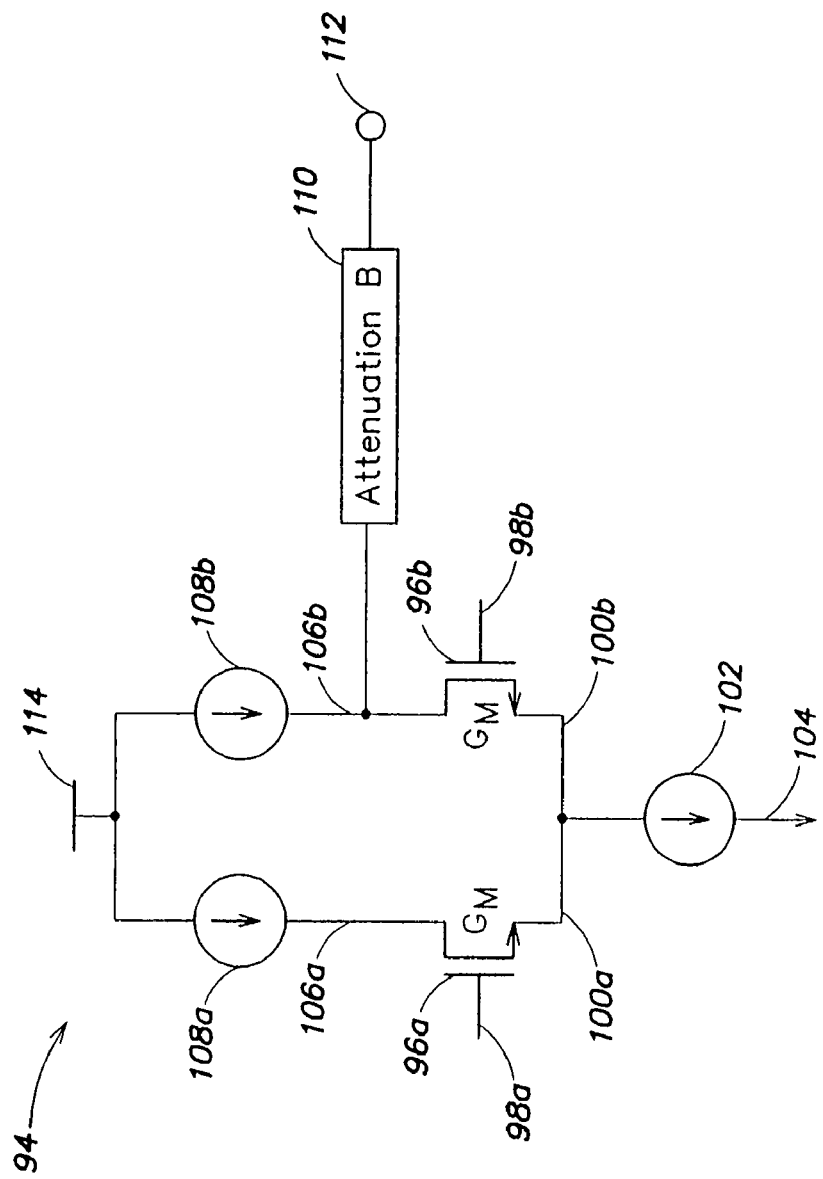
FIG. 7 illustrates one implementation of the amplifier of FIG. 6 according to an embodiment of the invention.

FIG. 7 illustrates an exemplary implementation of the amplifier 92 of FIG. 6 wherein the effective impedance of the amplifier that determines the thermal noise spectral density is less than the effective impedance of the amplifier that determines the thermal noise bandwidth. Amplifier 94 of FIG. 7 is a standard operational amplifier having attenuation in the forward path.

In particular, the amplifier 94 includes a pair of transistors 96a-b having gates that are respectively coupled to inverting input 98a and non-inverting input 98b of the amplifier. Sources 100a-b of transistors 96a-b are coupled to a current source 102, which is in turn coupled to a supply voltage 104. Drains 106a-b of transistors 96a-b are respectively coupled to current sources 108a-b, which are in turn coupled to a supply voltage 114. An attenuation block 110 having an attenuation factor B is coupled between the drain 106b of transistor 96b and output 112 of amplifier 94.

The noise contributed by attenuation block 110 should be negligible compared to the amplifier noise. As such, attenuation block 110 limits the loop bandwidth without contributing to the noise spectral density, satisfying of Equation 15. Also, it should be appreciated that while attenuation block 110 in FIG. 7 is shown as voltage attenuation at the output of an operational amplifier, signal attenuation (voltage, current or otherwise) at any point in the loop used to limit the bandwidth without contributing noise would satisfy Equation 15.

The dominant noise source of circuit 94 is transistors 96. As discussed above, attenuation block 110 is constructed in a manner such that it does not contribute significant noise in the amplifier 94. The noise power spectral density and the noise bandwidth of amplifier 94 can be expressed as shown in Equations 16 and 17, below:

$$\text{noise spectral density} = 2 * \frac{8kT}{3g_m} \tag{16}$$

$$\text{noise bandwidth} = \frac{g_m}{C} * \frac{1}{2\pi} * \frac{\pi}{2} * B \tag{17}$$

where k is Boltzmann's constant, T is the ambient temperature, and $g_m$ is the transconductance of amplifier 94. Based on Equations 16 and 17, the effective noise spectral density and bandwidth impedances can be expressed as shown in Equations 18 and 19, respectively:

$$Z_{NSD} = \frac{4}{3*g_m} \tag{18}$$

$$Z_{BW} = \frac{B}{g_m} \tag{19}$$

As may be appreciated from Equations 18 and 19, the bandwidth-limiting impedance $Z_{BW}$ is larger than the effective noise spectral density $Z_{NSD}$ impedance by the inverse of the attenuation factor B. This leads to a reduction in the sampled thermal noise power by that same factor of B.

Figure 8:
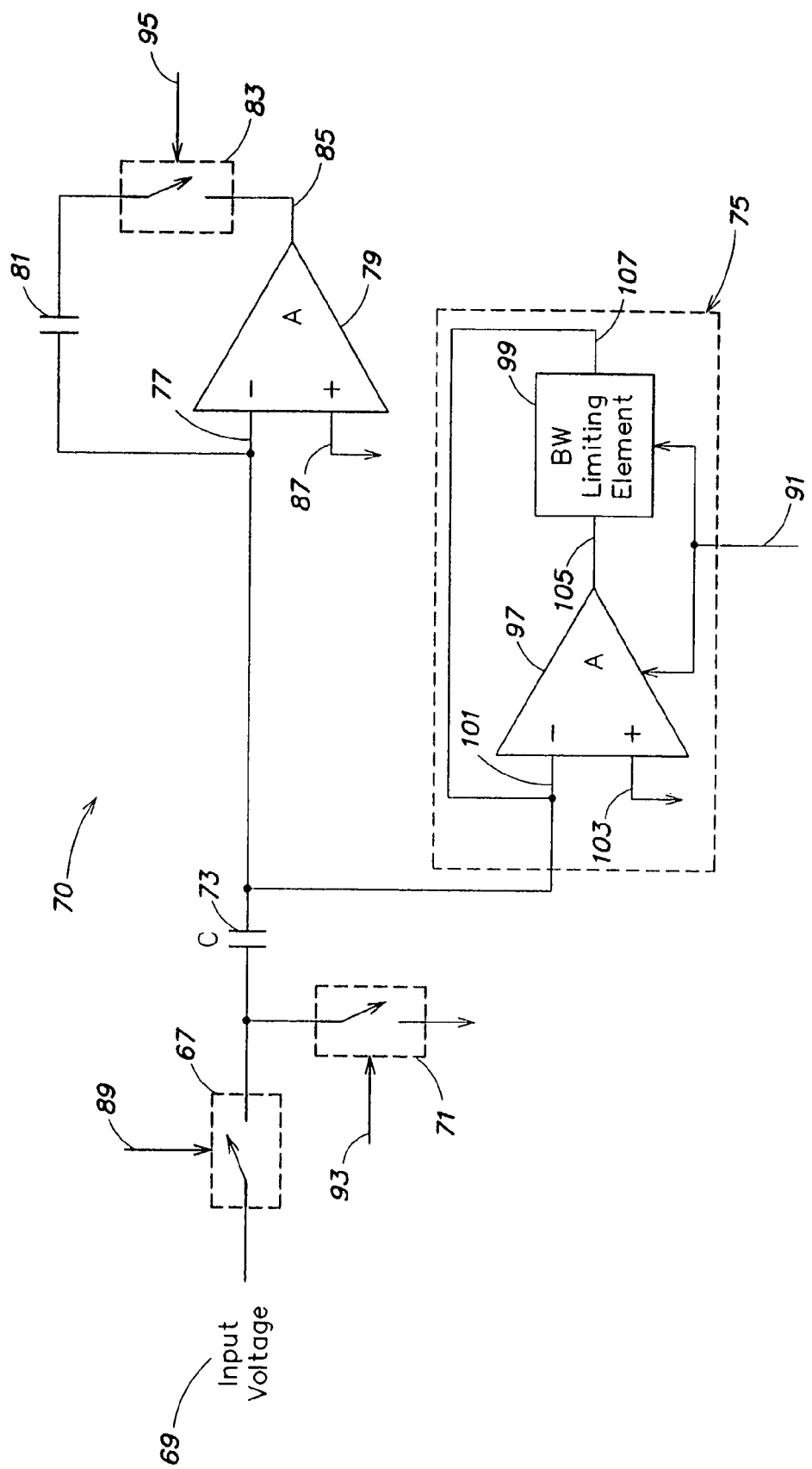
FIG. 8 illustrates a sample and hold circuit according to an embodiment of the invention, wherein the sample and hold circuit is a modified version of the circuit of FIG. 2 including an amplifier having a bandwidth-limiting element in the feedback path of the amplifier.

FIG. 8 illustrates another embodiment of the invention wherein the switching block 75 of FIG. 5 has been implemented using an amplifier 97 and a bandwidth-limiting element 99. The circuit 70 of FIG. 8 includes a first sample switch 67 coupled between an input voltage 69 and a first hold switch 71 coupled to ground. A first capacitor 73 is coupled at one end to the first sample switch 67 and the first hold switch 71. The other end of capacitor 73 is coupled to switching block 75 and an inverting input 77 of an amplifier 79. A second capacitor 81 and a second hold switch 83 are coupled in series between the inverting input 77 and an output 85 of amplifier 79. A non-inverting input 87 of amplifier 79 is coupled to ground.

Switching block 75 includes amplifier 97 and bandwidth-limiting element 99. An inverting input 101 of amplifier 97 is coupled to first capacitor 73 and an output 107 of bandwidth-limiting element 99. A non-inverting input 103 of amplifier 97 is coupled to ground. The output of amplifier 97 is coupled to the input of bandwidth-limiting element 99 at a node 105. In the embodiment of FIG. 8, amplifier 97 is the dominant noise source. Further, amplifier 97 has a sufficiently wide bandwidth so that bandwidth-limiting element 99 determines the overall thermal noise bandwidth. While an implementation of bandwidth-limiting element 99 may have a thermal noise spectral density associated with it, this noise may be ignored because bandwidth-limiting element 99 appears in the feedback loop of amplifier 97 after the gain of amplifier 79. Bandwidth-limiting element 99 determines the thermal noise bandwidth of the sampled noise.

During a sample phase of circuit 70, sample switch 67 is switched to an on state (i.e., a closed position) via first control signal 89, while hold switches 71 and 83 remain off (i.e., open). Likewise, during a sample phase of circuit 70, switching block 75 is switched to an on state, such that a connection is made between first capacitor 73 and a virtual ground formed at inverting input 101. Second control signal 91 controls the state of switching block 75 by activating or deactivating a portion of switching block 75. For example, amplifier 97 may be disabled by removing the power supplied to the amplifier or by other means. Alternatively, an open circuit may be created in switching block 75, for example in amplifier 97, in bandwidth-limiting element 99, or in the feedback loop therebetween. Thus, during a sample phase of circuit 70, first capacitor 73 is coupled between input voltage 69 and a virtual ground, and a charge proportional to input voltage 69 is stored on first capacitor 73. During a hold phase of circuit 70, first and second hold switches 71 and 83 are switched to an on state via third and fourth switch control signals 93 and 95, respectively, while sample switch 67 and switching block 75 are switched to an off state. When sample switch 67 and switching block 75 are switched to an off state, the charge on first capacitor 73 is frozen. When first and second hold switches 71 and 83 are switched to an on state, the charge previously stored on first capacitor 73 will be transferred to second capacitor 81.

Figure 9:
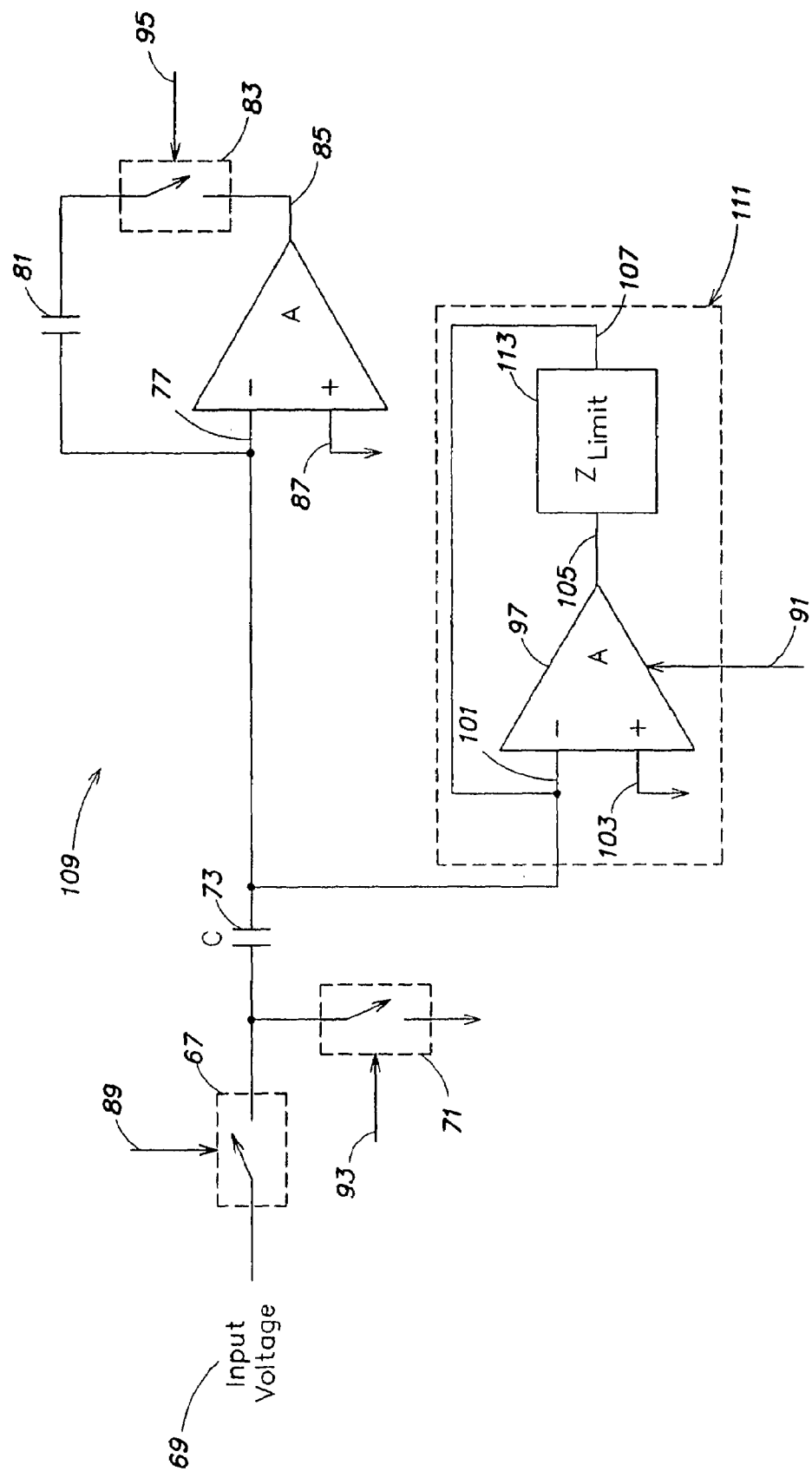
FIG. 9 illustrates a sample and hold circuit according to an embodiment of the invention, wherein the bandwidth-limiting element of FIG. 8 has been implemented using an impedance.

FIG. 9 illustrates the circuit shown in FIG. 8 wherein the bandwidth-limiting element 99 has been implemented as an impedance-bearing element 113. Thus, circuit 109 of FIG. 9 includes the elements of circuit 65 described in connection with FIG. 8, but includes impedance bearing element 113 in switching block 111 in place of bandwidth-limiting element 99 in switching block 75 (FIG. 8). Impedance bearing element 113 is selected such that it has an impedance, $Z_{LIMIT}$, that is sufficiently large so that it will determine the thermal noise bandwidth. Due to the Miller Effect, the impedance of element 113 will appear 1+A times smaller from the perspective of inverting input 101, where A is the gain of amplifier 97. In particular, the Miller reduced $Z_{LIMIT}$ is larger than the effective impedance of the amplifier when the amplifier is in a unity gain configuration, so that the noise bandwidth of the amplifier loop will be determined by impedance bearing element 113. If the noise bandwidth of the amplifier loop is determined by $Z_{LIMIT}$, the noise bandwidth of the circuit 109 can be expressed as shown below in Equation 20:

$$\text{noise bandwidth} = \frac{1+A}{Z_{LIMIT}C} * \frac{1}{2\pi} * \frac{\pi}{2} \quad (20)$$

where A is the gain of amplifier 97, C is the capacitance of capacitor 73 on which charge is sampled, and $Z_{LIMIT}$ is the impedance of impedance bearing element 113.

Because impedance bearing element 113 is in the feedback path of amplifier 97, amplifier 97 is the dominant noise source in circuit 111 and will determine the noise spectral density. Thus, the noise power spectral density of the circuit 109 can be expressed as:

$$\text{noise power spectral density} = \left(2 * \frac{8kT}{3g_m}\right) \quad (21)$$

where k is Boltzmann's constant, T is the ambient temperature, and $g_m$ is the transconductance of the amplifier. By applying Equations 20 and 21 to Equation 1, the sampled thermal noise power (in $V^2$) can be expressed as shown in Equation 22.

$$\text{noise power} = \left(2 * \frac{8kT}{3g_m}\right) * \left(\frac{A+1}{Z_{LIMIT}C} * \frac{1}{2\pi} * \frac{\pi}{2}\right) \quad (22)$$

By canceling terms, Equation 22 may be simplified to Equation 23, shown below.

$$\text{noise power} = \frac{4}{3} * \frac{kT(A+1)}{g_m Z_{LIMIT}C} \quad (23)$$

Thus, if $(A+1)/(g_m Z_{LIMIT})$ is less than ¾, the noise power that is sampled onto capacitor 73 will be less than kT/C. The noise bandwidth, as expressed in Equation 20, and the total noise power, as expressed in Equation 23, can be varied by varying $Z_{LIMIT}$. Equation 23 is an extension of Equation 15 in the case that $Z_{NSD}=1/g_m$ and $Z_{BW}=Z_{LIMIT}/(1+A)$.

Figure 10:
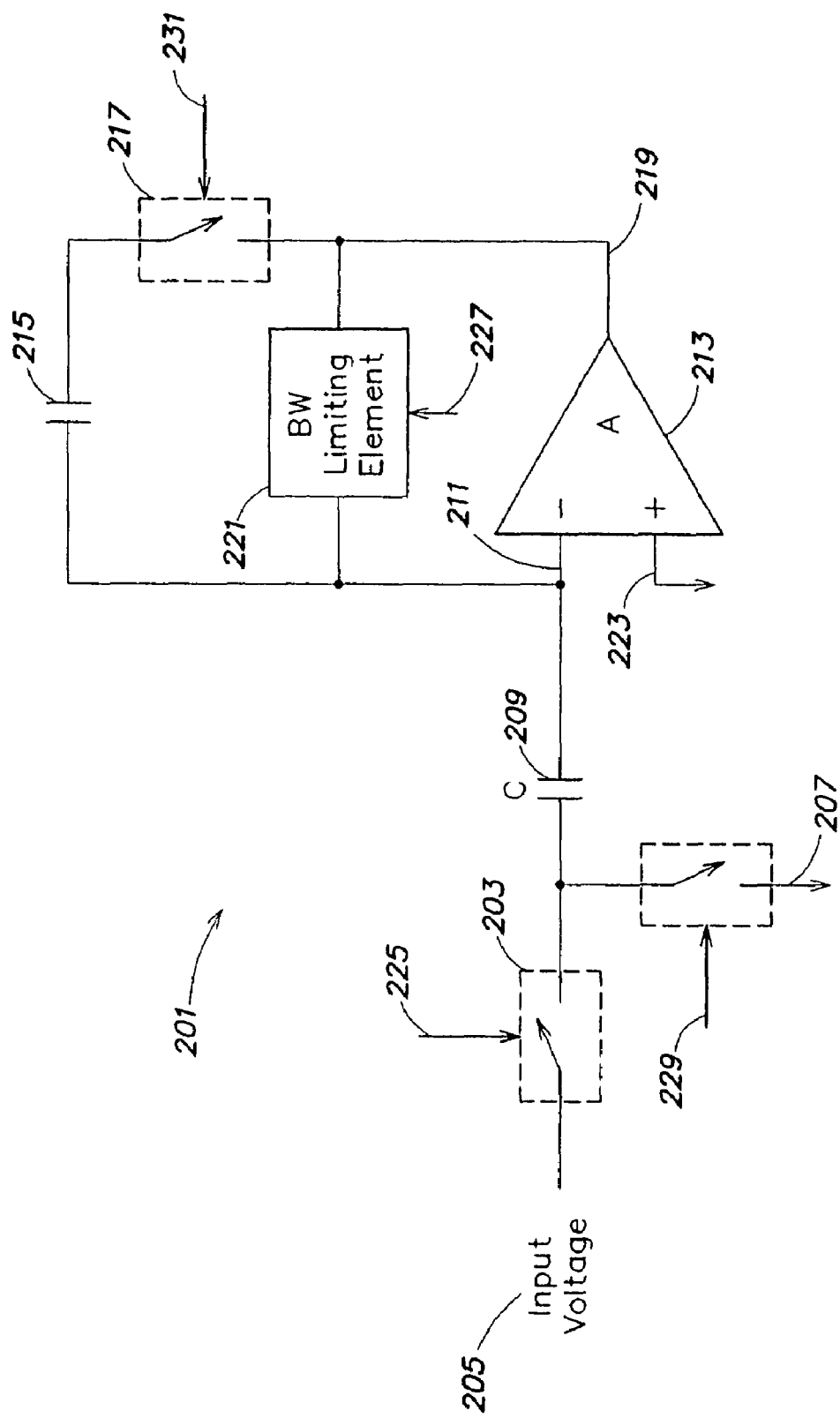
FIG. 10 illustrates a sample and hold circuit according to an embodiment of the invention, wherein the sample and hold circuit is a modified version of the circuit of FIG. 3 including a bandwidth-limiting element.

FIG. 10 illustrates another embodiment of the invention. According to this embodiment, the sample and hold circuit of FIG. 3 has been modified to omit the second sample switch 63 and include a bandwidth-limiting element 221 that is controllable via a switch control signal 227. The circuit 201 of FIG. 10 includes a first sample switch 203 coupled between an input voltage 205 and a first hold switch 207 coupled to ground. A first capacitor 209 is coupled at one end between the first sample switch 203 and the first hold switch 207, and at the other end to an inverting input 211 of an amplifier 213. A second capacitor 215 and a second hold switch 217 are coupled in series between the inverting input 211 and an output 219 of amplifier 213. Bandwidth-limiting element 221 is coupled in parallel with second capacitor 215 and second hold switch 217. A non-inverting input 223 of amplifier 213 is coupled to ground.

During a sample phase of circuit 201, sample switch 203 and bandwidth-limiting element 221 are switched to an on state (i.e., closed) via first and second switch control signals 225 and 227, respectively, while hold switches 207 and 217 remain off. When this occurs, first capacitor 209 is coupled between input voltage 205 and a virtual ground at inverting input 211 of amplifier 213, and a charge proportional to input voltage 205 is stored on first capacitor 209. During a hold phase of circuit 201, first and second hold switches 207 and 217 are switched to an on state via third and fourth switch control signals 229 and 231, respectively, while sample switch 203 and bandwidth-limiting element 221 are switched to an off state. When sample switch 203 and bandwidth-limiting element 221 are switched to an off state, the charge on first capacitor 209 is frozen. When first and second hold switches 207 and 217 are switched to an on state, the charge previously stored on first capacitor 209 will be transferred to second capacitor 215.

In the configuration of FIG. 10, bandwidth-limiting element 221 will limit the bandwidth of the sampled thermal noise and amplifier 213 will be the dominant thermal noise source. Although bandwidth-limiting element 221 will generate some thermal noise, the noise will be generated in the feedback loop of amplifier 213 and can therefore be ignored. If we assume that the amplifier has a single stage and that the input transistors of amplifier 213 are the dominant thermal noise source, the noise power spectral density of the sampled thermal noise can be expressed as shown below in Equation 24:

$$\text{noise power spectral density} = \left(2 * \frac{8kT}{3g_m}\right) \quad (24)$$

where k is Boltzmann's constant, T is the ambient temperature, and $g_m$ is the transconductance of amplifier 213. The bandwidth of the sampled thermal noise can be expressed as shown below in Equation 25. where it is assumed that A>>1:

$$\text{noise bandwidth} = \left(\frac{A}{Z_{BW}C} * \frac{1}{2\pi} * \frac{\pi}{2}\right) \quad (25)$$

where A is the gain of amplifier 213, $Z_{BW}$ is the impedance of bandwidth-limiting element 221, and C is the capacitance of capacitor 45 on which charge is sampled. In Equation 25, the first term ($A/Z_{BW}C$) represents the bandwidth of bandwidth-limiting element 221 (in radians/second). The second term ($\pi/2$), when multiplied by the first term, represents the thermal noise bandwidth of the switched capacitor circuit. The third term ($1/2\pi$) converts the bandwidth in radians/second to a bandwidth in cycles/second or Hertz. By applying Equations 24 and 25 to Equation 1, the sampled thermal noise power (in $V^2$) can be expressed as shown in Equation 26.

$$\text{noise power} = \left(2 * \frac{8kT}{3g_m}\right) * \left(\frac{A}{Z_{BW}C} * \frac{1}{2\pi} * \frac{\pi}{2}\right) \quad (26)$$

By canceling terms, Equation 26 may be simplified to Equation 27, shown below.

$$\text{noise power} = \frac{4}{3} * \frac{kTA}{Z_{BW}C} \quad (27)$$

Thus, it may be appreciated that the power of the sampled thermal noise may be reduced below kT/C by selecting amplifier 213 and bandwidth-limiting element 221 such that $A/(Z_{BW}*g^m)$ is less than 3/4.

Figure 11:
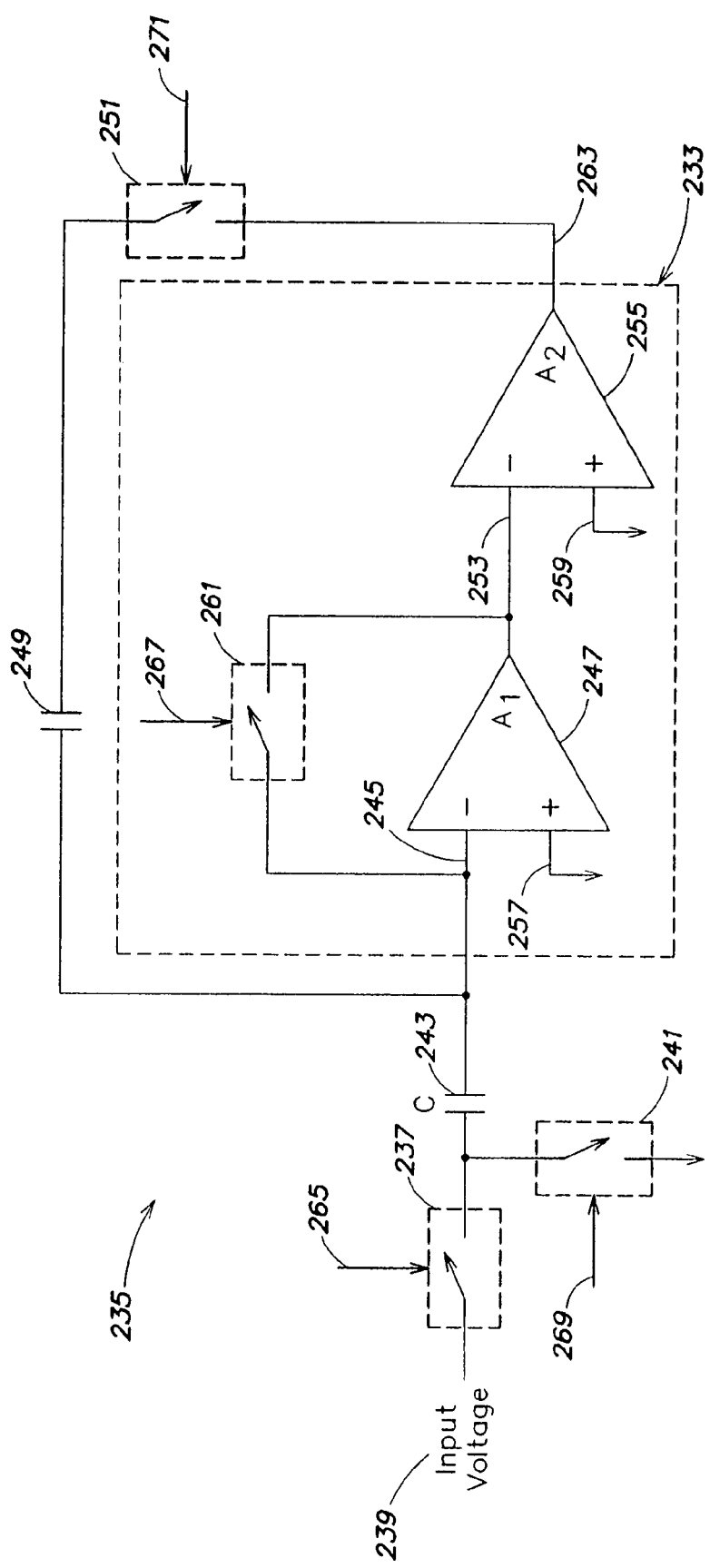
FIG. 11 illustrates a sample and hold circuit according to an embodiment of the invention, wherein the sample and hold circuit is a modified version of the circuit of FIG. 3 including an additional amplifier.

Another embodiment of the invention is shown in FIG. 11. According to this embodiment, the sample and hold circuit of FIG. 3 has been modified to omit the amplifier 49 and instead include two cascaded amplifiers, one having a switch in its feedback loop. The circuit 235 of FIG. 11 includes a first sample switch 237 coupled between an input voltage 239 and a first hold switch 241 coupled to ground. A first capacitor 243 is coupled at one end to the first sample switch 237 and the first hold switch 241, and at the other end to an inverting input 245 of a first amplifier 247. An output of first amplifier 247 is coupled to an inverting input of a second amplifier 255 at a node 253. Non-inverting inputs 257, 259 of first and second amplifiers 247 and 255, respectively, are each coupled to ground. A second sample switch 261 is coupled between inverting input 245 and output 253 of first amplifier 247. A second capacitor 249 and a second hold switch 251 are coupled in series between inverting input 245 of first amplifier 247 and output 263 of second amplifier 255.

During a sample phase of circuit 235, sample switches 237 and 261 are switched to an on state (i.e., closed) via first and second switch control signals 265 and 267, respectively, while hold switches 241 and 251 remain off. When this occurs, first capacitor 243 is coupled between input voltage 239 and a virtual ground at inverting input 245 of first amplifier 247, and a charge proportional to input voltage 239 is stored on first capacitor 243. During a hold phase of circuit 235, first and second hold switches 241 and 251 are switched to an on state via third and fourth switch control signals 269 and 271, respectively, while sample switches 237 and 261 are switched to an off state. When sample switches 237 and 261 are switched to an off state, the charge on first capacitor 243 is frozen. When first and second hold switches 241 and 251 are switched to an on state, the charge previously stored on first capacitor 243 will be transferred to second capacitor 249.

In FIG. 10, increasing the gain of amplifier 213 will improve linearity and distortion during the hold mode. However, to keep the same loop bandwidth, the impedance of the bandwidth-limiting element 221 must be increased in proportion to the gain of amplifier 213. This is impractical for high gains because such an impedance would be difficult to physically implement, and a large impedance in the feedback path could cause loop instability. In FIG. 11, two amplifiers 247 and 255 are used. First amplifier 247 limits bandwidth of sampled thermal noise and dominates the thermal noise spectral density. First amplifier 247 is chosen such that the effective impedance that determines the thermal noise spectral density is less than the effective impedance that determines the thermal noise bandwidth. Second amplifier 255 is chosen to have a high gain to improve the linearity and reduce the distortion of the signal at the output 263 of second amplifier 255 during the hold mode. Thus, first amplifier 247 may have a lower gain, while the overall gain may be high, determined by the product of the gain of amplifiers 247 and 255. Equations 24 and 25, which respectively describe the spectral density of the sampled thermal noise and the bandwidth of the sampled thermal noise of FIG. 10 also apply to the configuration of FIG. 11, with the exception that first amplifier 247 determines both the noise spectral density and the effective bandwidth liming impedance, $Z_{BW}$.

Figure 12:
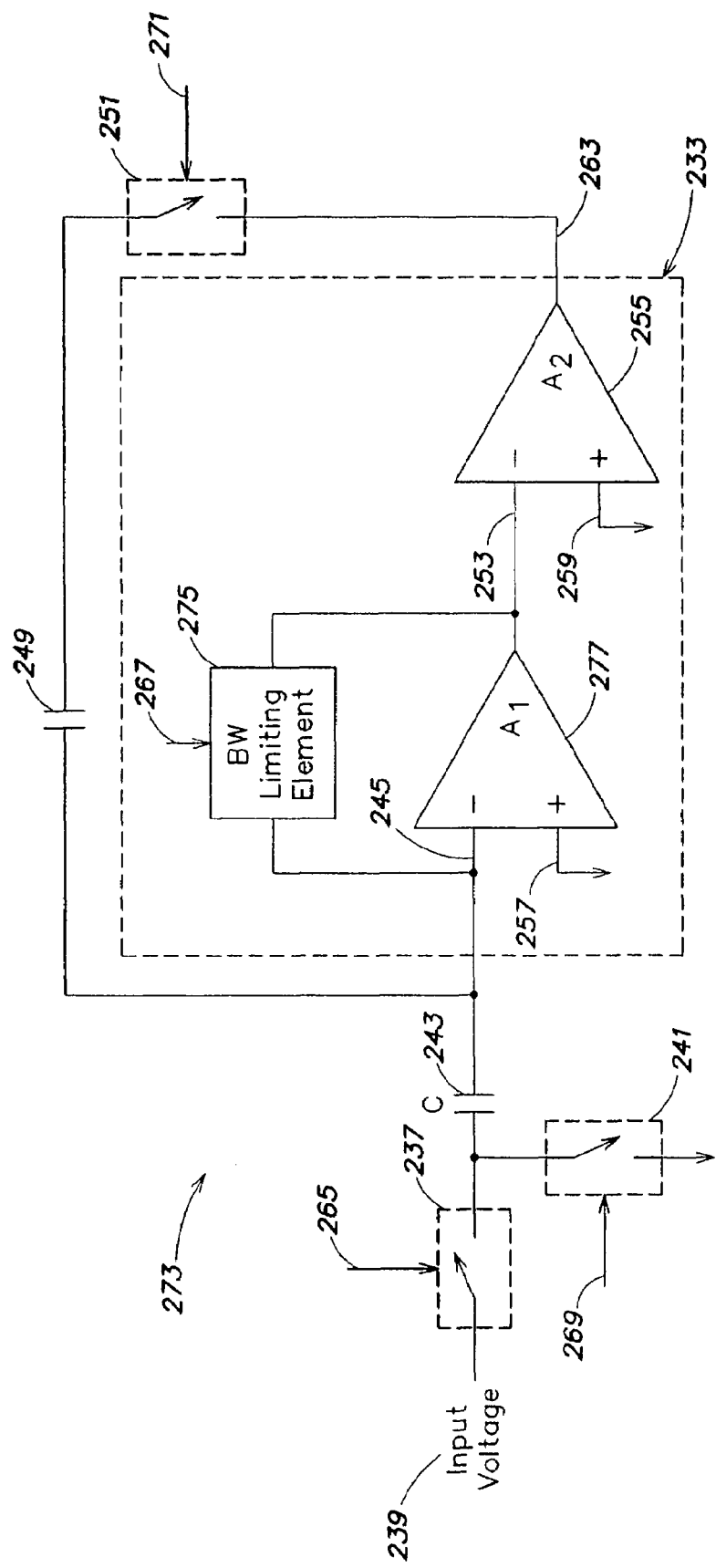
FIG. 12 illustrates a sample and hold circuit according to an embodiment of the invention, wherein a bandwidth-limiting element is included in the feedback path of the first amplifier of FIG. 11.

FIG. 12 illustrates a further embodiment of the invention. The circuit 273 of FIG. 12 is constructed and operated in substantially the same manner as the circuit 235 of FIG. 11, but omits the second sample switch 261 of FIG. 11 and instead includes a bandwidth-limiting element 275 controlled by second switch control signal 267. Thus, during the sample phase, unlike the circuit of FIG. 11, the first amplifier has bandwidth-limiting element 275 in its feedback path. Because the gain of first amplifier 277 does not need to be large for distortion reasons, $Z_{BW}$ of the bandwidth-limiting element does not need to be large. Thus, the first amplifier 277 of FIG. 12 is less likely to cause stability problems than the first amplifier 213 of FIG. 10.

Figure 13:
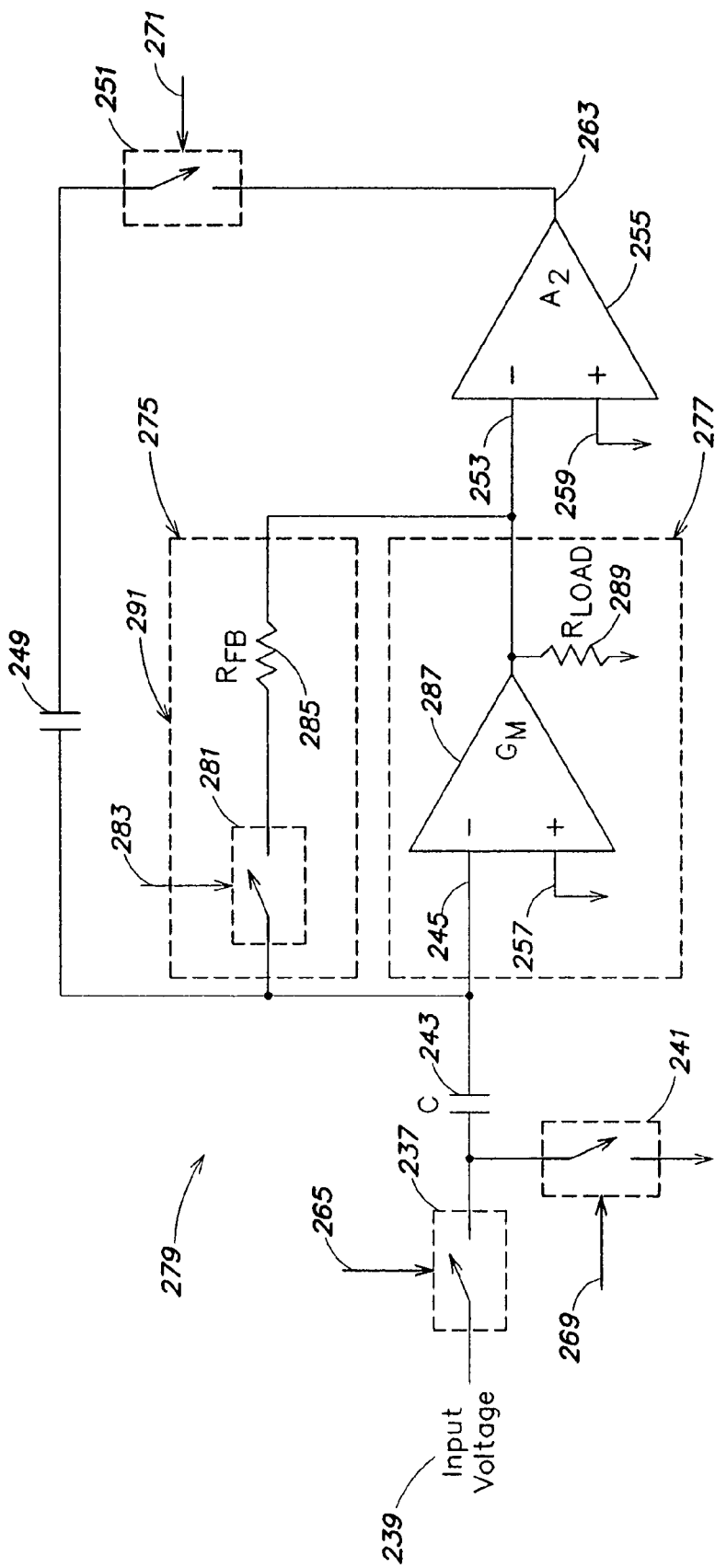
FIG. 13 illustrates a sample and hold circuit according to an embodiment of the invention illustrating an implementation of the first amplifier and bandwidth-limiting element of FIG. 12.

FIG. 13 illustrates another embodiment of the invention. The circuit 279 of FIG. 13 is substantially the same as circuit 273 of FIG. 12, but shows an implementation of bandwidth-limiting element 275 and first amplifier 277. In particular, bandwidth-limiting element 275 is implemented using a switch 281 controlled by a switch control signal 283 and a resistor 285. First amplifier 277 is implemented using a transconductance amplifier 287 and a resistor 289 coupled between an output of the transconductance stage and ground.

In the configuration of FIG. 13, bandwidth-limiting element 275 will limit the bandwidth of the sampled thermal noise and first amplifier 277 will be the dominant thermal noise source. Assuming the resistance of resistor 285 is much greater than the resistance of resistor 289, the gain of loop 291 may be expressed as follows:

$$A = g_m * R_{LOAD} \quad (28)$$

where $g_m$ is the transconductance of transconductance amplifier 287 and $R_{LOAD}$ is the resistance of resistor 289. Applying Equation 28 to Equation 25, and substituting the resistance of resistor 285 (i.e., $R_{FB}$) for $Z_{BW}$ in Equation 25, the noise bandwidth at inverting input 245 may be expressed shown in Equation 29.

$$\text{noise bandwidth} = \frac{g_m R_{LOAD}}{R_{FB}C} * \frac{1}{2\pi} * \frac{\pi}{2} \quad (29)$$

The noise power spectral density of transconductance amplifier 287 is the same as expressed in Equation 24. Thus, the noise power of amplifier 287, referred to the node at inverting input 245 of transconductance amplifier 287, may be expressed as shown in Equation 30, which is simplified in Equation 31.

$$\text{amplifier noise power} = \left(2 * \frac{8kT}{3g_m}\right) * \left(\frac{g_m R_{LOAD}}{R_{FB}C} * \frac{1}{2\pi} * \frac{\pi}{2}\right) \quad (30)$$

$$\text{amplifier noise power} = \frac{4}{3} * \frac{kT}{C} * \frac{R_{LOAD}}{R_{FB}} \quad (31)$$

The thermal noise power of resistor 285, referred to the node at inverting input 245 of transconductance amplifier 287, may be expressed as shown in Equation 32, which is simplified in Equation 33.

$$\begin{array}{l}\text{feedback resistor}\\ \text{noise power}\end{array} = (4kTR_{FB}) * \frac{1}{A^2} * \left(\frac{A}{R_{FB}C} * \frac{1}{2\pi} * \frac{\pi}{2}\right) \quad (32)$$

$$\begin{array}{l}\text{feedback resistor}\\ \text{noise power}\end{array} = \frac{kT}{C} * \frac{1}{A} \quad (33)$$

Thus, Equations 32 and 33 express the noise power for transconductance amplifier 287 and resistor 285. The noise power of resistor 289 may be neglected because it has a lower resistance than resistor 285 and therefore a lower spectral density. It may be appreciated from Equations 32 and 33 that the total noise power of circuit 279 is not bounded by kT/C. To reduce the noise power contribution of resistor 285 below kT/C, the gain of loop 291 may be set above one. To reduce the noise power contribution of transconductance amplifier 287 below kT/C, the value of $R_{LOAD}/R_{FB}$ may be decreased below ¾.

Figure 14:
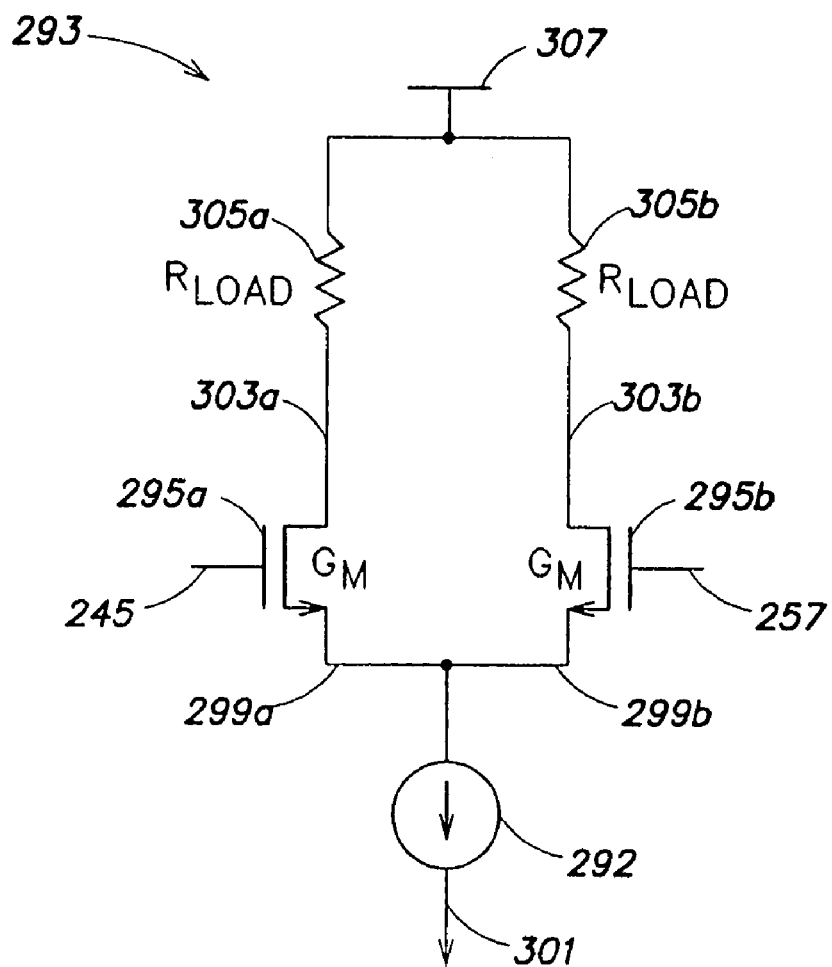
FIG. 14 illustrates one implementation of the transconductance amplifier of FIG. 13 according to an embodiment of the invention.

FIG. 14 illustrates a more detailed potential implementation of the amplifier 277 shown in FIGS. 12 and 13. In particular, the amplifier 293 of FIG. 14 illustrates a pair of transistors 295a-b having gates that are respectively coupled to inverting input 245 and non-inverting input 257 of the amplifier. Sources 299a-b of transistors 295a-b are coupled to a current source 292, which is in turn coupled to a supply voltage 301. Drains 303a-b of transistors 295a-b are coupled to resistors 305a-b, which are in turn coupled to a supply voltage 307.

Figure 15:
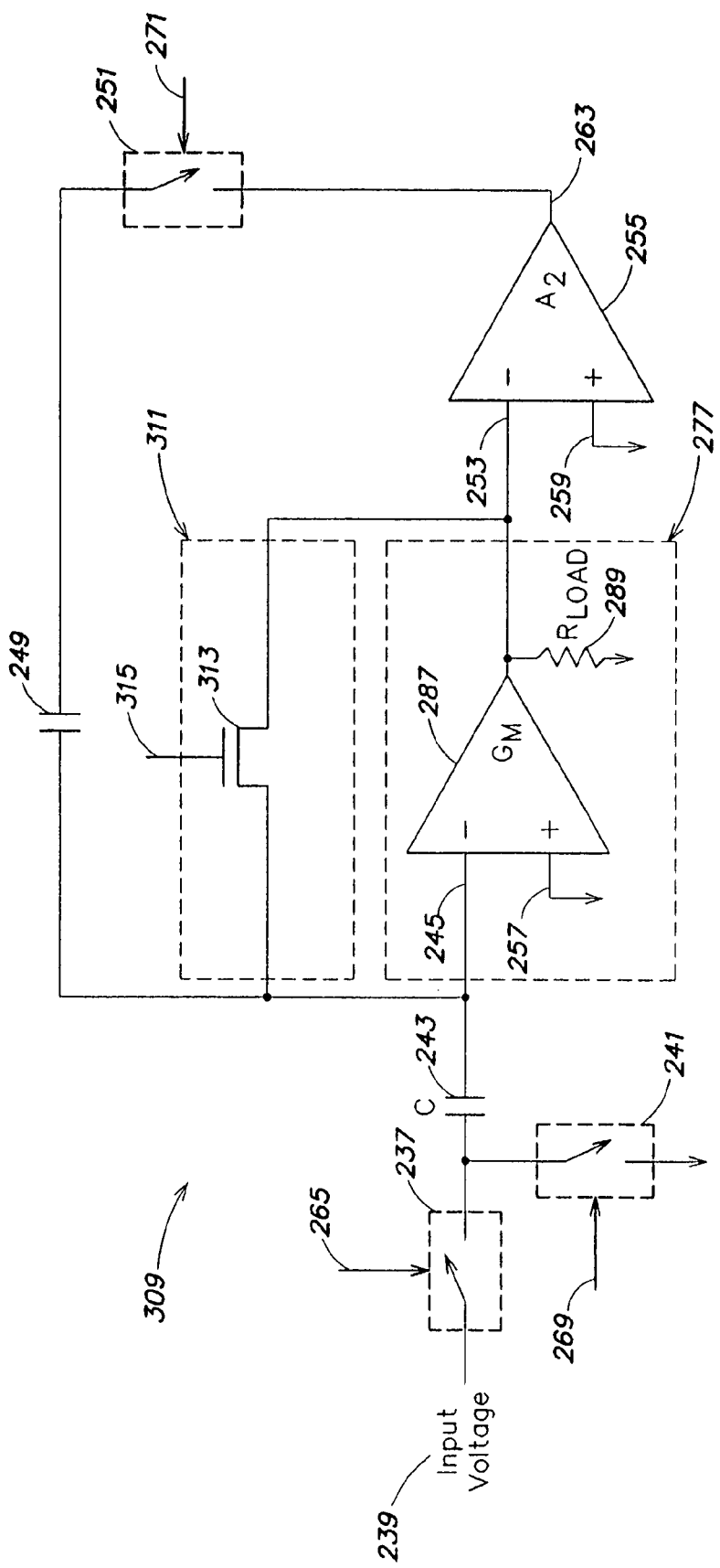
FIG. 15 illustrates a sample and hold circuit according to an embodiment of the invention illustrating another implementation of the bandwidth-limiting element of FIG. 13.

A further embodiment of the invention is shown in FIG. 15. The circuit 309 of FIG. 15 is substantially the same as the circuit 279 of FIG. 13, but shows an alternate implementation of bandwidth-limiting element 275. In particular, the bandwidth-limiting element 311 of FIG. 15 is implemented using a weak MOS transistor 313 controlled by switch control signal 315. Weak MOS transistor 313 may have an on-resistance that is greater than the open-loop output resistance of first amplifier 277 (i.e., $R_{LOAD}$).

Figure 16:
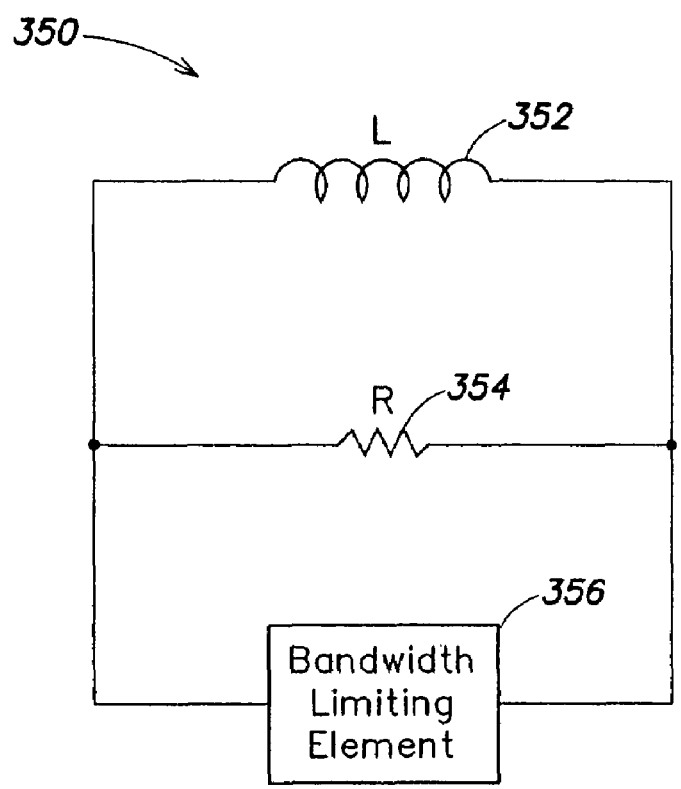
FIG. 16 illustrates an example of a non-sampled, non-capacitor based circuit in accordance with an embodiment of the invention.

It should be appreciated that although embodiments described herein related to sample and hold circuits and, in particular, switched capacitor circuits, the invention is not limited in this respect. Principles of the invention may be applied to capacitor circuits that are not sample and hold circuits, and/or circuits that include energy storage elements other than capacitors. FIG. 16 illustrates an example of a non-sampled, non-capacitor based circuit in which the integrated thermal noise may be reduced below theoretical limits by employing the principles described herein.

Circuit 350 of FIG. 16 is a non-sampling inductive circuit including an inductor 352, a resistor 354, and a bandwidth-limiting element 356, each of which is coupled in parallel. Inductors, like capacitors, are noiseless circuit elements. Thus, inductor 352 does not contribute thermal noise to the system. Likewise, bandwidth-limiting element 356 constructed such that it does not contribute significant thermal noise to the system. Therefore, resistor 354 is the dominant source of thermal noise. Bandwidth-limiting element 356 is constructed so that it limits the bandwidth of the thermal noise. Inductor 352 is a current storage element. Thus, the noise spectral density (in Amps²/Hz), noise bandwidth (in Hz), and total integrated noise current (in Amps²) through the inductive storage element can be expressed as set forth in Equations 34-36, below:

$$\text{noise spectral density} = \frac{4kT}{R} \quad (34)$$

$$\text{noise bandwidth} = \frac{Z_{BW}}{L} * \frac{1}{2\pi} * \frac{\pi}{2} \quad (35)$$

$$\text{noise power} = \frac{kT}{L} * \frac{Z_{BW}}{R} \quad (36)$$

where k is Boltzmann's constant, T is the ambient temperature, L is the inductance of inductor 352, R is the resistance of resistor 354, and $Z_{BW}$ is the effective impedance of bandwidth-limiting element 356. As shown by Equation 36, the noise power of circuit 350 may be reduced below kT/L by selecting the resistance of resistor 354 and the effective impedance of bandwidth-limiting element 356 such that $Z_{BW}/R$ is less than one. In other words, the noise power of circuit 350 may be reduced below kT/L by choosing $Z_{BW}$ and R such that $Z_{BW}$ is less than R. Thus, it may be appreciated that the invention is not limited to sampling operations, nor to a switched capacitor implementation. The principles described herein may be applied to any system to reduce the integrated thermal noise on a storage element.

Having described several illustrative embodiments of the invention, various alterations, modifications and improvements will readily occur to those skilled in the art. Such alterations, modifications and improvements are intended to be in the spirit and scope of the invention. Accordingly, the foregoing description is by way of example only and is not intended as limiting. The invention is limited only as defined in the following claims and the equivalents thereto.

What is claimed is:

1. A sampling circuit, comprising:
a sampling capacitor to store a charge, the sampling capacitor being exposed to an ambient temperature; and
circuitry to sample the charge onto the capacitor, wherein thermal noise is also sampled onto the capacitor, and wherein the circuitry is constructed such that the power of the thermal noise sampled onto the capacitor is less than the product of the ambient temperature and Boltzmann's constant divided by a capacitance of the sampling capacitor.

2. The sampling circuit of claim 1, wherein the circuitry is adapted to couple the sampling capacitor between a first potential and a second potential different from the first potential in response to a control signal.

3. The sampling circuit of claim 1, wherein the circuitry comprises:
   a first amplifier having a first input coupled to a terminal of the capacitor at a node, a second input, and an output; and
   means for limiting the bandwidth of a signal at the node.

4. The sampling circuit of claim 3, wherein the means for limiting the bandwidth of a signal at the node is coupled between the first input and the output of the first amplifier.

5. The sampling circuit of claim 4, wherein the means for limiting the bandwidth of the signal at the node is adapted to limit the bandwidth of the signal to a greater extent than the first amplifier and contribute less noise to the signal than the first amplifier.

6. The sampling circuit of claim 4, wherein the means for limiting the bandwidth is an impedance.

7. The sampling circuit of claim 4, further comprising a second amplifier having a first input coupled to the output of the first amplifier and a second input coupled to a reference potential.

8. The sampling circuit of claim 4, wherein the means for limiting the bandwidth is a switch having an on-resistance that is greater than an output impedance of the first amplifier.

9. A circuit, comprising:
   an energy storage element comprising an input and output; and
   circuitry coupled to the energy storage element to control a signal stored in the energy storage element, wherein the signal includes thermal noise having an associated power spectral density and bandwidth, and wherein a portion of the circuitry that dominates the thermal noise power spectral density has an effective impedance of $Z_{NSD}$ and a portion of the circuitry that dominates the thermal noise bandwidth has an effective impedance of $Z_{BW}$, wherein $Z_{NSD}$ is less than $Z_{BW}$.

10. The circuit of claim 9, wherein the circuit is a sampling circuit.

11. The circuit of claim 9, wherein the storage element is a capacitor.

12. The circuit of claim 9, wherein the portion of the circuit that dominates the thermal noise power spectral density and the portion of the circuit that dominates the thermal noise bandwidth are not the same.

13. The circuit of claim 9, wherein the portion of the circuit that dominates the thermal noise power spectral density is an amplifier coupled to the output of the storage element and the portion of the circuit that dominates the thermal noise bandwidth is also the amplifier.

14. The circuit of claim 9, wherein the circuitry comprises:
   a first amplifier having a first input coupled to the output of the energy storage element at a node, a second input, and an output, wherein the first amplifier is the dominant thermal noise source of the circuit; and
   means for limiting the bandwidth of a signal at the node.

15. The circuit of claim 14, wherein the means for limiting the bandwidth of a signal at the node is coupled between the first input and the output of the first amplifier.

16. The circuit of claim 14, wherein the means for limiting the bandwidth is an impedance.

17. The circuit of claim 14, further comprising a second amplifier having a first input coupled to the output of the first amplifier and a second input coupled to a reference potential.

18. The circuit of claim 14, wherein the means for limiting the bandwidth is a switch having an on-resistance that is greater than an output impedance of the first amplifier.

19. A method of controlling thermal noise sampled onto a capacitor, comprising an act of:
   independently controlling the power spectral density of the thermal noise and the bandwidth of the thermal noise, by controlling at least one of the power spectral density of the thermal noise and the bandwidth of the thermal noise independently from the other.

20. The method of claim 19, wherein the act of independently controlling comprises independently controlling the power spectral density of the thermal noise and the bandwidth of the thermal noise.

21. The method of claim 19, further comprising an act of:
   sampling a charge and thermal noise onto the capacitor, the capacitor being exposed to an ambient temperature;
   wherein the act of independently controlling comprises independently controlling at least one of the power spectral density of the thermal noise and the bandwidth of the thermal noise such that the thermal noise sampled onto the capacitor is less than the product of the ambient temperature and Boltzmann's constant divided by a capacitance of the capacitor.

22. The method of claim 19, wherein:
   the capacitor is coupled to circuitry to sample charge onto the capacitor;
   a portion of the circuitry that dominates the power spectral density of the thermal noise has an effective impedance of $Z_{NSD}$ and a portion of the circuitry that dominates the bandwidth of the thermal noise has an effective impedance of $Z_{BW}$; and
   the act of independently controlling comprises controlling at least one the effective impedance of the portion of the circuit that dominates the power spectral density of the thermal noise and the effective impedance of the portion of the circuit that dominates the bandwidth of the thermal noise such that $Z_{NSD}$ is less than $Z_{BW}$.

23. A circuit, comprising:
   an input and an output;
   an amplifier coupled to the input;
   a sampling capacitor coupled between the input of the circuit and the amplifier; and
   an attenuator coupled between the amplifier and the output;
   wherein the attenuator is adapted to limit the bandwidth of a signal at the output of the circuit and contribute less noise to the signal than the amplifier.

* * * * *